(12) United States Patent
Ruoff

(10) Patent No.: US 6,284,345 B1
(45) Date of Patent: Sep. 4, 2001

(54) DESIGNER PARTICLES OF MICRON AND SUBMICRON DIMENSION

(75) Inventor: Rodney S. Ruoff, Clayton, MO (US)

(73) Assignee: Washington University, St. Louis, MO (US)

( * ) Notice: Subject to any disclaimer, the term of this patent is extended or adjusted under 35 U.S.C. 154(b) by 0 days.

(21) Appl. No.: 08/980,980

(22) Filed: Dec. 8, 1997

(51) Int. Cl.$^7$ ............................... B32B 3/22; B32B 5/02; B28B 5/00
(52) U.S. Cl. ..................... 428/143; 428/206; 428/323; 428/402; 427/197; 427/198; 264/297.8
(58) Field of Search ..................... 428/323, 328, 428/329, 325, 327, 206, 208, 143, 148, 149, 402; 427/197, 198, 199; 264/297.1, 297.8, 297.9

(56) References Cited

U.S. PATENT DOCUMENTS

| | | | |
|---|---|---|---|
| 4,945,050 | 7/1990 | Sanford et al. | 435/172.1 |
| 5,036,006 | 7/1991 | Sanford et al. | 435/172.1 |
| 5,066,587 | 11/1991 | Jones et al. | 435/172.1 |
| 5,100,792 | 3/1992 | Sanford et al. | 435/172.1 |

(List continued on next page.)

FOREIGN PATENT DOCUMENTS

| | | |
|---|---|---|
| 0486233 B1 | 7/1995 | (EP) . |
| 0434616 B1 | 11/1995 | (EP) . |
| 0686697 A2 | 12/1995 | (EP) . |

OTHER PUBLICATIONS

"Synthesis and Characterization of Anisometric Cobalt Nanoclusters" by Charles P. Gibson et al., *Science*, vol. 267 (Mar. 3, 1995) 1338–1340.

"Nanometer size platinum particle arrays: catalytic and surface chemical properties" by P.W. Jacobs et al., *Surface Science*, 372 (1997) L249–L–253.

"Magnetic and transport properties of ferromagnetic particulate arrays fabricated on superconducting thin films" by O. Geoffroy et al.; *Journal of Magnetism and Magnetic Materials* 121 (1993) 223–226.

"Magnetic wire and box arrays (invited)" by Atsushi Maeda et al., *J. Appl. Phys.* 76(10), (Nov. 15, 1994) 6667–6670.

"Ultra–small metal particle arrays produced by high resolution electron–beam lithography" by H.G. Craighead et al., *J. Appl. Phys.* 53(11), (Nov. 1982), 7186–7188.

"Nanolithographically defined magnetic structures and quantum magnetic disk (invited)" by Stephen Y. Chou et al., *J. Appl. Phys.* 79(8), (Apr. 15, 1996), 6101–6106.

"Patterned Magnetic Nanostructures and Quantized Magnetic Disks" by Stephen Y. Chou, *Proceedings of the IEEE*, vol. 85, No. 4 (Apr. 1997), 652–671.

"Properties and measurement of scanning tunneling microscope fabricated ferromagnetic particle arrays (invited)" by A.D. Kent et al., *J. Appl. Phys.* 76(10), (Nov. 15, 1994), 6656–6660.

*Primary Examiner*—Paul Thibodeau
*Assistant Examiner*—Ramsey Zacharia
(74) *Attorney, Agent, or Firm*—Howell & Haferkamp, L.C.

(57) ABSTRACT

Micron-sized particles are produced in quantity by one of various methods, including generally the steps of preparing a substrate surface through a lithographic process, the surface being characterized by defining a plurality of elements, depositing a layer of particle material on the substrate surface including the elements, processing the substrate surface to isolate the material deposited on the elements, and separating the particles from the elements. The size and shape of the elements predetermine the size and shape of the particles. The elements may comprise, inter alia, pillars of photoresist or spaces on the substrate surrounded and defined by photoresist.

6 Claims, 12 Drawing Sheets

U.S. PATENT DOCUMENTS

| | | | |
|---|---|---|---|
| 5,147,740 | 9/1992 | Robinson | 430/5 |
| 5,149,655 | 9/1992 | McCabe et al. | 435/287 |
| 5,179,022 | 1/1993 | Sanford et al. | 435/287 |
| 5,236,762 * | 8/1993 | Suzuki et al. | 428/141 |
| 5,240,842 | 8/1993 | Mets | 435/172.3 |
| 5,240,855 | 8/1993 | Tomes | 435/287 |
| 5,366,850 | 11/1994 | Chen et al. | 430/314 |
| 5,371,015 | 12/1994 | Sanford et al. | 435/287 |
| 5,460,831 | 10/1995 | Kossovsky et al. | 424/493 |
| 5,478,744 | 12/1995 | Sanford et al. | 435/285.1 |
| 5,525,510 | 6/1996 | McCabe et al. | 435/285.3 |
| 5,541,072 | 7/1996 | Wang et al. | 435/7.21 |
| 5,567,503 * | 10/1996 | Sexton et al. | 428/143 |
| 5,654,078 * | 8/1997 | Ferronato | 428/143 |
| 5,753,418 | 5/1998 | Tsai et al. | 430/313 |
| 5,149,655 | 9/1992 | McCabe et al. | 435/287 |
| 5,179,022 | 1/1993 | Sanford et al. | 435/287 |
| 5,236,762 * | 8/1993 | Suzuki et al. | 428/141 |
| 5,240,842 | 8/1993 | Mets | 435/172.3 |
| 5,240,855 | 8/1993 | Tomes | 435/287 |
| 5,366,850 | 11/1994 | Chen et al. | 430/314 |
| 5,371,015 | 12/1994 | Sanford et al. | 435/287 |
| 5,460,831 | 10/1995 | Kossovsky et al. | 424/493 |
| 5,478,744 | 12/1995 | Sanford et al. | 435/285.1 |
| 5,525,510 | 6/1996 | McCabe et al. | 435/285.3 |
| 5,541,072 | 7/1996 | Wang et al. | 435/7.21 |
| 5,567,503 * | 10/1996 | Sexton et al. | 428/143 |
| 5,654,078 * | 8/1997 | Ferronato | 428/143 |
| 5,753,418 | 5/1998 | Tsai et al. | 430/313 |

* cited by examiner

SUB-100 nm QUARTZ IMPRINTER

SILICON SUBSTRATE

APPLY MOLD RELEASE COMPOUND AND ADHESION PROMOTER

APPLY POLYMER RESIN

HEAT ABOVE Tg − IMPRINT WITH IMPRINTER − COOL OR IMPRINT − EXPOSE WITH UV

RELEASE MOLD AND PLASMA CLEAN TRENCHES

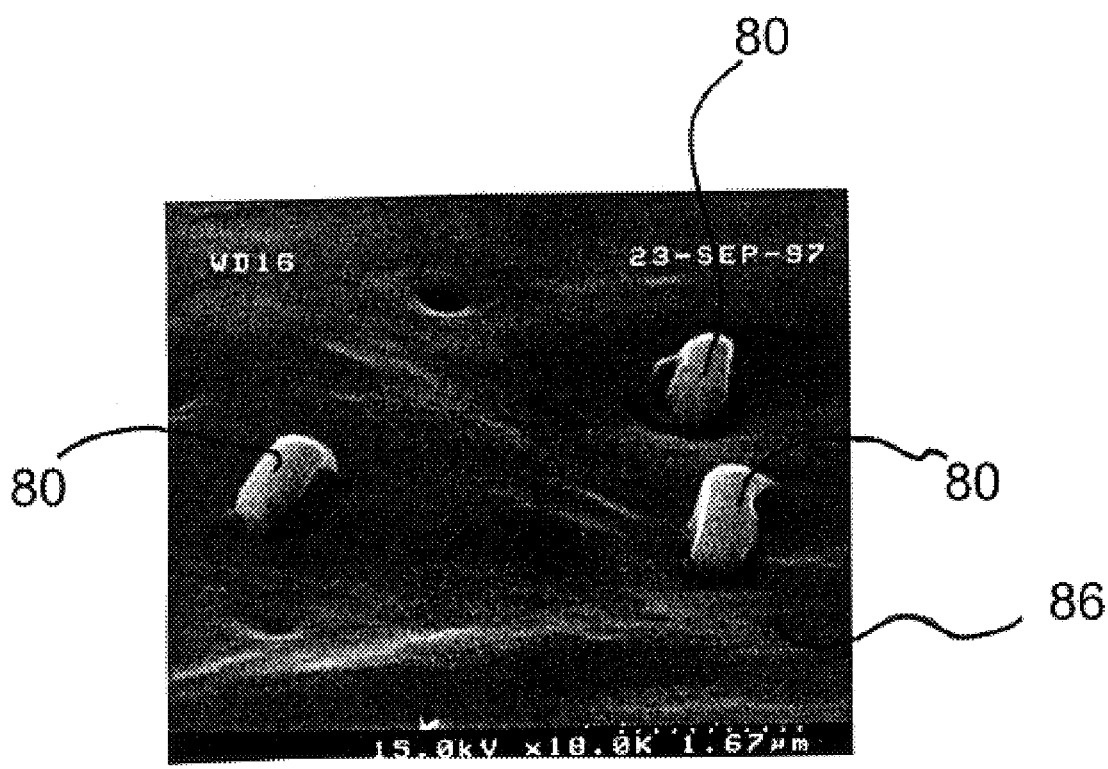
F I G. 10

DESIGNER PARTICLES OF MICRON AND SUBMICRON DIMENSION

BACKGROUND AND SUMMARY

Small particles, i.e. particles approaching one micron or less, are known in the art. These particles are made with various techniques and may be comprised of widely varying materials. For example, particles may be made of gold from colloidal gold solutions, tungsten from a process involving grinding, sifting, and filtering, and still other lesser used materials such as stainless steel, frozen water, and plastic spheres. There are still other similarly sized particles made from other materials as well. However, all of these particles produced by these various methods share certain characteristics. For example, the inventor is unaware of any particles, or process for producing particles, which have a uniform size and shape regardless of whether there is an opportunity to choose a particular shape. For example, many processes produce particles which are essentially globular, but those globular shapes vary from particle to particle and also with respect to their size. Still other processes produce particles which have irregular shapes and with particles having different shapes within the same yield. Many of the processes have a significant range in particle size with some of these processes producing particles having less than a smooth distribution in sizes. In other words, there is not a consistent number of particles of each particle size contained within a harvest of any particular process. Furthermore, some particle materials and processes are not capable of being produced in all sizes. Still another limitation in the prior art is that the kinds of materials which may be utilized are process dependent. In other words, certain types of metal may not be used to produce particles through the colloidal solution process due to the chemistry.

For illustrative purposes, the inventor will now describe one particular use of micron-sized particles. These are used in implementing a technology known as biolistics. With this technology, inert or biologically active particles are propelled at cells at a speed whereby the particles penetrate the surface of the cells and become incorporated into the interior of the cells. The process can be used to mark cells or tissue or to biochemically affect tissues or tissue in situ as well as single cells in vitro. There are various kinds of apparatus used to propel the particles into the cells, examples of which are disclosed in U.S. Pat. Nos. 5,371,015; 5,478,744; and 5,179,022, the disclosures of which are incorporated herein by reference. These patents also disclose various uses of the micron-sized particles in the area of biolistics. These uses include gene therapy for the correction of genetic disorders by expressing healthy versions of the defective gene, genetic immunization for eliciting immune responses against specific antigen after inoculating cells with the DNA encoding the antigen, genetic engineering of animals for producing new and useful phenotypes, the determination of functions of genes in an in-vivo setting, and cancer therapy for introducing therapeutic genes into tumorous cells. Again, these uses are only exemplary as biolistics is a relatively new and evolving technology.

As might be expected, it would be desirable in implementing biolistics for a technician to be able to choose both a particle's shape as well as its size and be ensured that a collection of these particles would be uniformly shaped and uniformly sized in order that a uniform effect may be expected upon their use. Furthermore, the particles may be particularly shaped in order to enhance the particular application desired to be implemented. One such example would be to provide particles having an interior surface, much like a donut-shaped particle, so that the interior surface may be filled with a biologically active material desired to be delivered into the cell. Typically, in the prior art as known to the inventor, particles are coated with the biologically active materially and as might be expected some of this biologically active material is lost as the particles are propelled and injected into the cells. This happens through abrasion, acceleration, etc. of the particle's surface as it is delivered.

To the extent that the particle size, shape, and other of its properties can be controlled, new uses for some micron particles may be considered. For example, controlling the particle's size and rendering it magnetizable permits consideration of the particles' use for reliable and safe transportation through a patient's blood system to a desired site with a magnetic field gradient and under computer control. Still other new uses may be considered and are limited solely by the ingenuity of the scientist or engineer.

Also known in the prior art are substrates having arrays of sub-micron sized metal deposits. For example, nanometer size platinum particle arrays were prepared by electron beam lithography. The Pt particles were 50 nm in diameter and spaced 200 nm apart on an oxidized silicon wafer. See P. W. Jacobs, et al., *Surface Science*, 372, L249–L253 (1997). Another example of e-beam patterning was the preparation of two-dimensional arrays of amorphous R—Co (R=Sm and Gd) square particles on 20 nm thick niobium films. See O. Geoffrey, et al., *Journal of Magnetism and Magnetic Materials*, 121, 223–226 (1993). A third example involved the deposition of $Ni_{80}Fe_{20}$ boxes with width and spacing of 1-$\mu$m thick on a PMMM resist film, followed by liftoff, which resulted in the production of "box" arrays of 50-nm thick $Ni_{80}Fe_{20}$ boxes with width and spacing of 1 $\mu$m. See A. Maeda, et al., *Journal of Applied Physics*, 76(10), 6667 (1994). A further example is the production of ultra-small particle arrays by high resolution electron beam lithography, in which arrays of silver and gold-palladium particles smaller than 10 nm in diameter and center-to-center spacings as low as 25 nm were made. See H. Craighead, et al., *Journal of Applied Physics*, 53(11), 7186 (1982).

Other methods of making metal particle arrays include by "nanosphere lithography" where uniformly sized latex spheres are deposited onto a substrate such that they closest-pack; metal deposition with liftoff results in, for example, triangle shaped particles on a hexagonal lattice. See J. Hulteen, et al., *Journal of Vacuum Science and Technology*, A 13(3), 1553 (1995). Another approach for making small metal particles is by fabricating them with a scanning tunneling microscope. In one approach, $Fe(CO)_5$ is decomposed by the tunneling electron beam, which results in the deposition on the substrate of small iron deposits with approximate diameter of 25 nm. See A.D. Kent, et al., *Journal of Applied Physics*, 76(10), 6656 (1994).

Nanoimprint lithography has been used to create metal patterns with feature size of 25 nm and spacing of 70 nm; compression imprinting followed by liftoff of a metal deposited layer results in the 25 nm particles on the substrate. See S. Y. Chou, et al., *Science*, 272, 85 (1996). These substrates were used with the deposits secured to the substrate and the inventor is unaware of any teaching or suggestion in the prior art that these deposits could be separated from the underlying substrate to produce discrete particles.

To solve these and other problems in the prior art, the inventor herein has succeeded in designing and developing a method of producing micron and submicron particles having a uniform pre-selected shape and size, as well as the particles themselves. With the inventor's process, the composition of each particle, its physical properties and chemical properties, may all be pre-selected or "designed" as desired to satisfy a particular need of the designer. The particles may be made from virtually any material amenable to deposition layering techniques, various different shapes, except perhaps for spheres or globular-shaped particles, of multi-layered construction from dissimilar materials, and engineered to exhibit desirable physical and chemical properties after formation.

Generally, the method of the present invention includes the steps of preparing a substrate and, more particularly, a surface on the substrate for receiving a layer of particle material. This preparation process includes a lithographic patterning of a surface of the substrate with any suitable lithography process. As explained more specifically in the preferred embodiment, the inventor has utilized photolithography including layering the substrate with photoresist and then exposing the substrate through a mask whose pattern is created using a CAD process. However, e-beam lithography, imprint lithography, x-ray lithography, or other kinds of lithographic processes as known in the art may be used as well. After the surface of the substrate is prepared, a layer of material is deposited on the substrate using any appropriate metal deposition process such as vapor deposition, sputter deposition, CVD deposition, or electro-deposition. One or more layers of particle material may be deposited, and the layers may be of the same or dissimilar materials so as to make layered or sandwich type particles. The last step in the process involves separating the particles from the substrate which, depending upon the particular process utilized, may include emerging the substrate in a solvent, vibrating the substrate such as by sonification, or chemical etching, or any other suitable such process. The particles may then be collected and washed thoroughly in order to ready the particles for further use.

The shape, size, and uniformity of the particles is determined and controlled in the lithographic step of preparing the substrate surface. As explained more completely in the detailed description of the preferred embodiment which follows, and in the event that photolithography is utilized, the photo mask pattern helps to determine these parameters. After its preparation, it is used to mask a light exposure for partially burning away a layer of photoresist to create elements for receiving the deposited layers of metal forming the particles. Therefore, it is important to prepare the mask with as accurate an image as is possible to ensure sharp lines and corners (if the particle shape so requires) so that the particles may be shaped and sized as desired.

While several advantages and features of the present invention of a process for making submicron-sized particles and the particles themselves have been explained, a more thorough understanding of the invention may be attained by referring to the drawings attached hereto and by studying the detailed description of the preferred embodiment which is provided for illustrative purposes.

BRIEF DESCRIPTION OF THE DRAWINGS

FIG. 10 is an electron microscope image illustrating several particles impacted into a surface as would be achieved in a biolistic particle application.

DETAILED DESCRIPTION OF THE PREFERRED EMBODIMENT

Figure 1B:
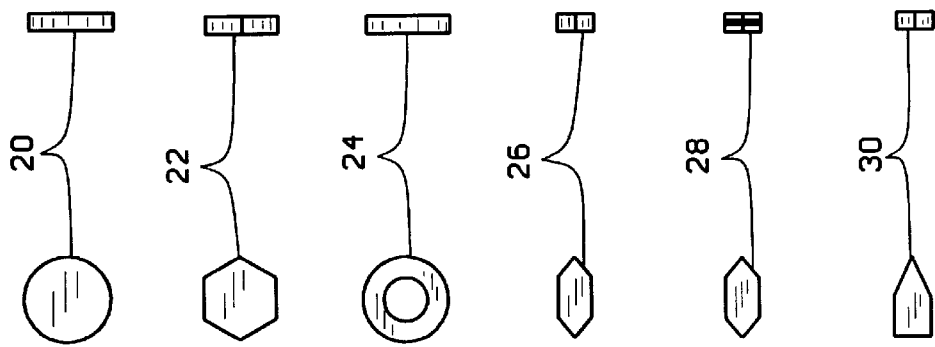
FIGS. 1A and 1B are views of illustrative shapes which the micron sized particles of the present invention may take.
Figure 1A:
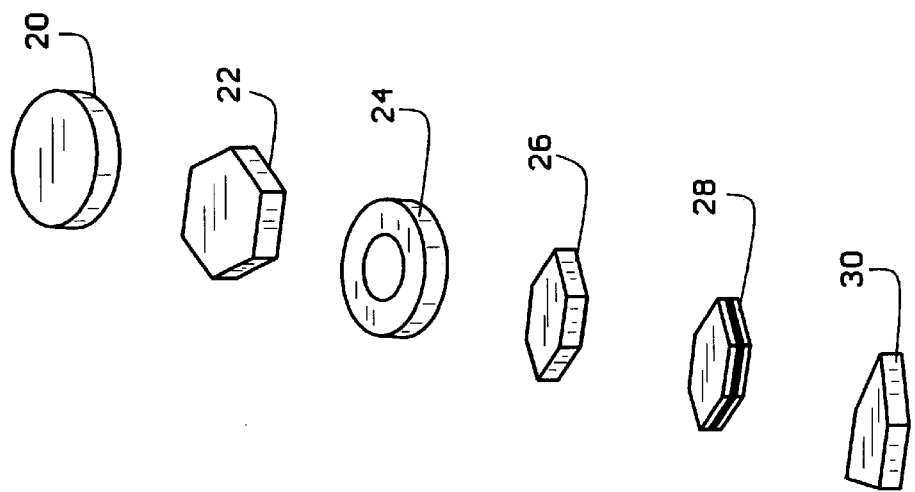
Figure 2A:
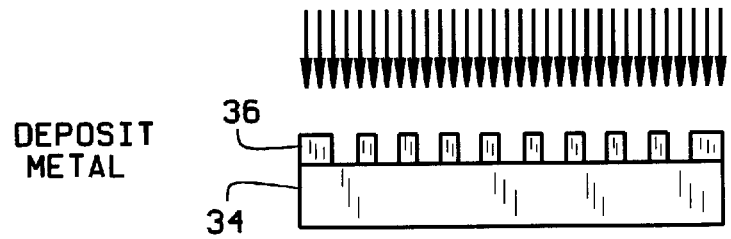
FIGS. 2A to D are views of the metal deposition step of the process after the substrate surface has been prepared with a lithographic process.
Figure 2B:
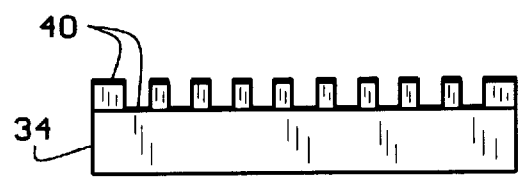
Figure 2C:
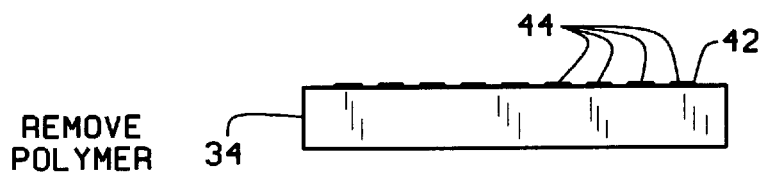
Figure 2D:
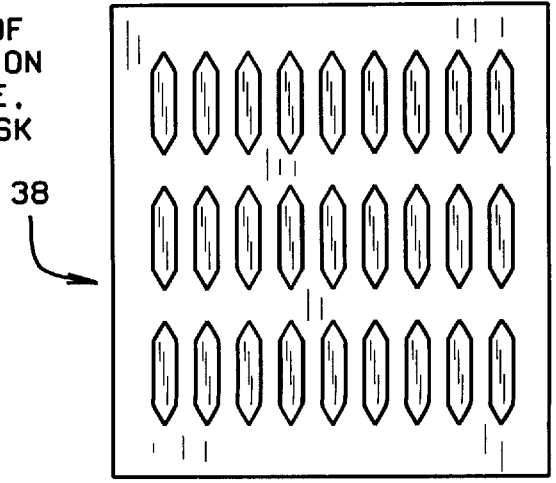
Figure 3A:
FIGS. 3A to E are several views of an imprint process for preparing the substrate.
Figure 3A:
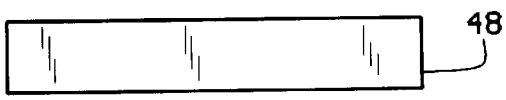
Figure 3B:
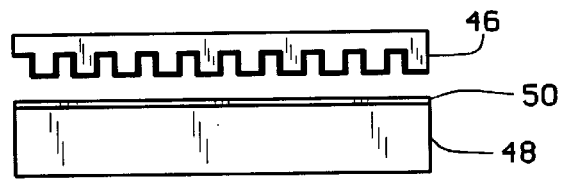
Figure 3C:
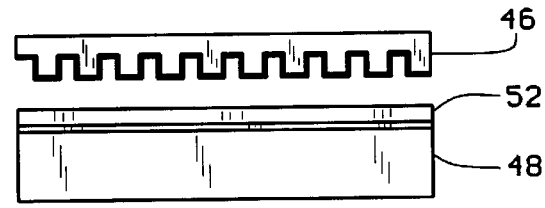
Figure 3D:
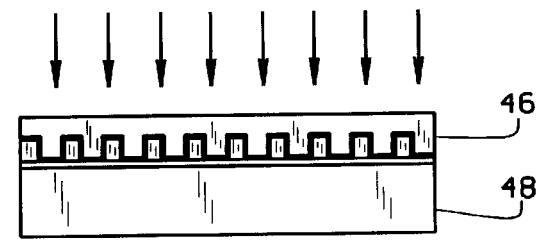
Figure 3E:
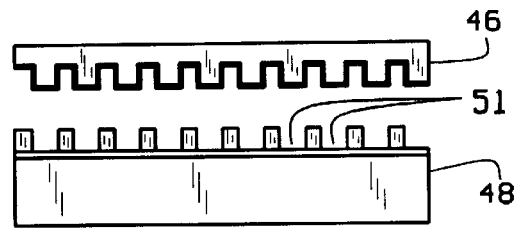
Figure 4A:
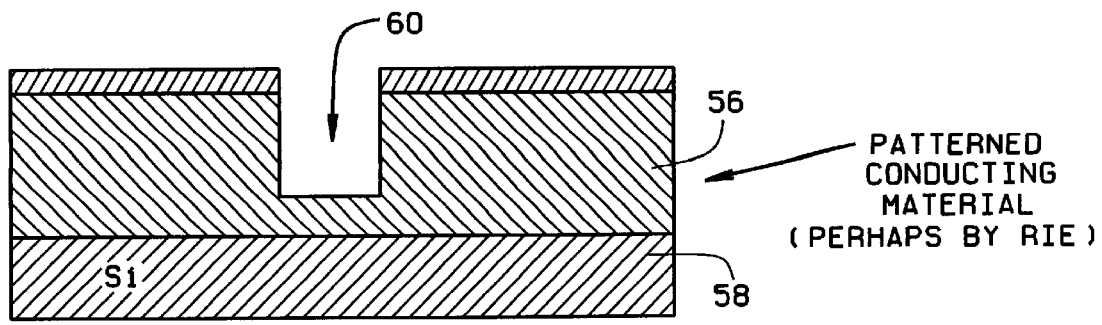
FIGS. 4A to D illustrate still another alternative process for forming the particles of the present invention.
Figure 4B:
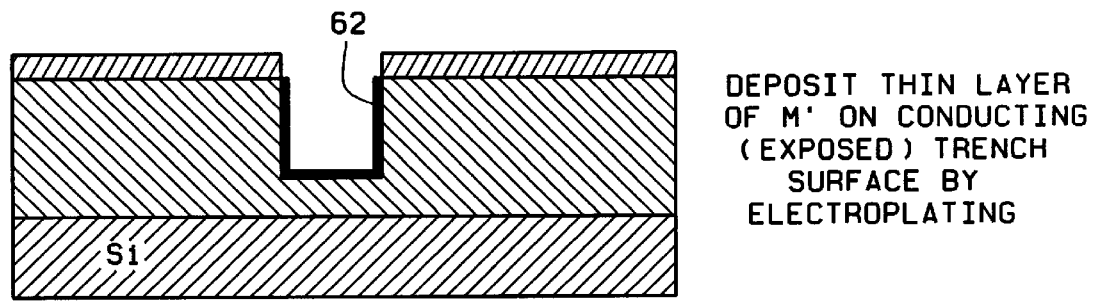
Figure 4C:
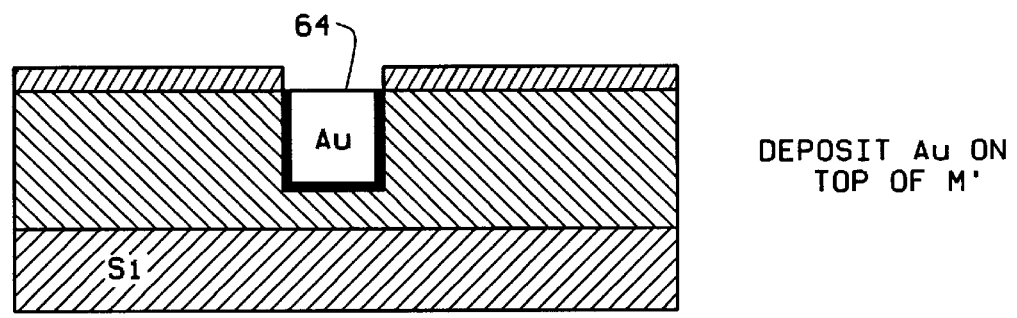
Figure 4D:
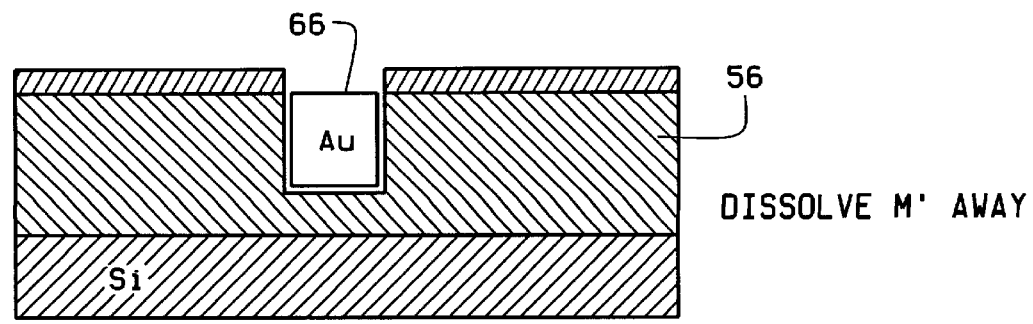
Figure 5A:
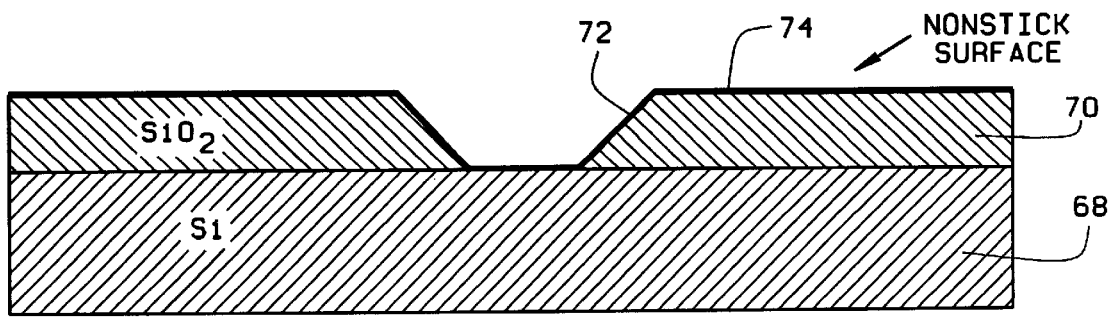
FIGS. 5A to D illustrate still another alternative process for forming the particles of the present invention.
Figure 5B:
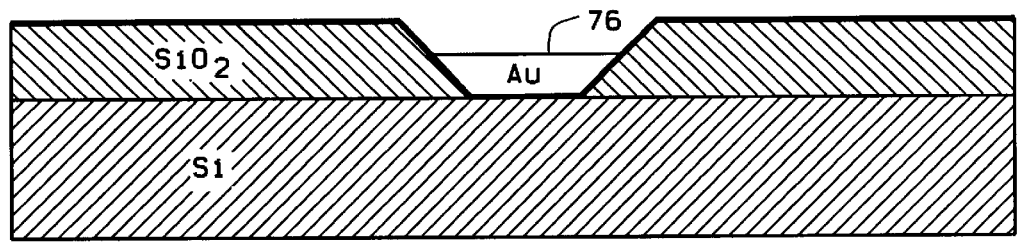
Figure 5C:
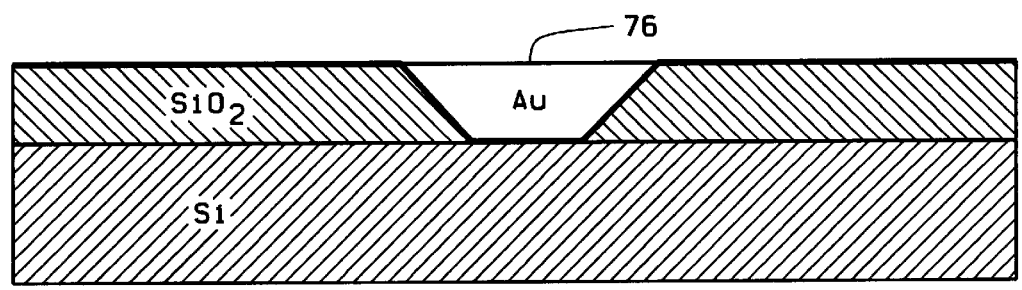
Figure 5D:
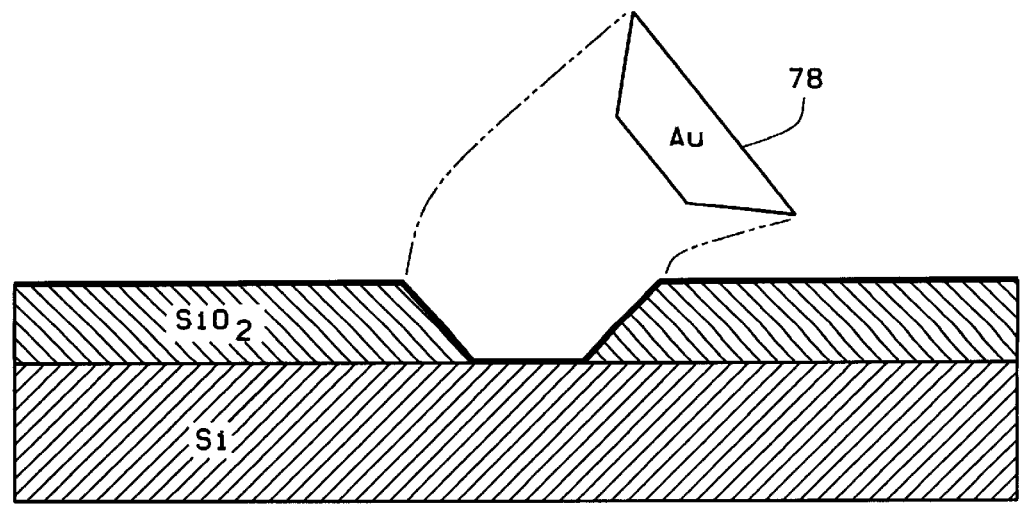

The present invention includes a process for forming micron-sized particles having a diameter of between about 0.1 microns and about 25 microns which are of uniform shape and size and which can be produced in relatively large numbers in a single pass through the process. It is contemplated by the inventor that particles even as small as 0.01 micron may be made with one or more of the methods disclosed herein, and in great number. As illustrated in the examples given herein, $8 \times 10^8$ particles having substantially the same shape and size may be produced all at the same time. The particle's shape may be as shown in FIGS. 1A to C and may include a disk 20, a regular polygon such as a hexagon 22, an annulus 24 with a central interior surface suitable for receiving and carrying any desired material, a double-pointed oblong particle 26, the same double-pointed oblong particle as shown at 26 except comprising multiple layers of dissimilar materials as at 28, and a flattened single-pointed particle 30. The particle shapes and sizes 20–30 are illustrated herein as examples, but they are not intended to be exhaustive. It is noted that many of the particles 22–30 are flattened although this is not necessarily the case. Other particle shapes and sizes may be utilized and are limited only by the imagination of the designer and the physical limitations of the processes used to prepare and coat the substrate.

In one embodiment, the process of the present invention is illustrated in its various steps as shown in FIGS. 2A to D. This process, and the other alternative processes, are more specifically described in the examples given herein. However, as an aid in understanding the overall invention, these various alternative processes will now be generally described. Again, with respect to FIG. 2, a substrate is first prepared and may consist of a layer of silicon 34 with a layer of photoresist 36 applied to a surface thereof. A mask 38 is next prepared with a pattern generated by a computer aided design (CAD) program. A data file is created for controlling an optical pattern generator which includes parameters for defining the particle shape, size and number. The pattern generator uses this file in creating an appropriate image for exposing the photoresist layer 36. The mask 38 may be a piece of glass coated with a thin layer of chromium and photosensitive polymer, i.e. photoresist. The mask 38 may either be prepared for use with positive photoresist or negative photoresist. As shown in FIG. 2, a positive photoresist is used so that the particles are formed on elements defined by surrounding photoresist (liftoff). In experiments, the inventor has found a positive photoresist may be desirable as it can contribute to greater resolution resulting in particles of smaller size and sharper edges in shape. After the mask 38 is used to expose the photoresist through UV light, the substrate was readied for deposition by developing and washing processes. A layer 40 of particle material was next deposited on the substrate including the portion of substrate created as holes in the photoresist 36 on the silicon layer 34. These elements 42 form the places at which the particles 44 are actually formed. The photoresist 36 is removed from the silicon layer 34 by, for example, being soaked in a solvent to dissolve the photoresist, and the particles 44 then may be separated through further soaking in solvents to dissolve a sacrificial layer (not shown) between the particles and the silicon layer 34. Thus, in implementation of the process of the present invention, a large number of particles of uniform shape and size are formed on a substrate and separated from the substrate, and harvested.

There are a variety of ways to pattern surfaces, and (as per this invention) to dislodge particles from them. To have a common term for the surface region upon which the particle resides prior to being dislodged, this is defined and referred to as the "element". This is not to be confused with chemical elements (the atoms). For example, if a pattern is created which has 800,000,000 pillars of 1 micron diameter, and the particles are formed on the pillars, then the pillar is the element. This can be the situation when a negative photoresist is used, or a reverse-image process, as is discussed in one of the specific examples below. In contrast, if a positive resist is used and developed, the elements would be the patterned substrate regions of the substrate, onto which the photoresist had originally been spun-coat (or in the case of imprint lithography, a polymer film is spun-coat which is not necessarily a photoresist). Metal would be deposited, the polymer layer removed, and an array of identical particles, each residing on an "element", would be present. The particles would then be removed from the substrate (which can be a sacrificial layer and for example dissolved with a solvent which does not etch the particles; or could be a non-stick surface so that the particles could be shaken loose, or pulled off with an adhesive surface such as scotch tape). Each "element" is the region below the particle prior to dislodging.

An alternative method may be utilized as shown in FIG. 3. As illustrated in FIG. 3A, an imprinter 46 is used with a silicon substrate 48 in this process. As shown in FIG. 3B, a mold release compound is applied to the imprinter 46 and an adhesion promoter 50 is applied to the silicon substrate 48. As shown in FIG. 3C, a polymer resin 52 is applied over the adhesion promotor 50. The imprinter 46 may then be heated and used to imprint its pattern into the polymer resin 52 as shown in FIG. 3D. With some materials, heating is not required. As illustrated in FIG. 3E, the mask 46 is withdrawn from the substrate leaving behind a pattern defining elements which may be further prepared prior to deposition of a layer of particle material by plasma cleaning. Metal would then be deposited. At the completion of this process, the size and shape of the particles has been determined by the size and shape of the elements 51. Again, as illustrated in FIG. 3, the elements 51 have been defined in terms of the border surrounding it with polymer resin 52. This same patterning approach may be utilized except that the elements are formed at the top of the polymer resin 52.

Still another alternative process for forming particles of the present invention include that which is disclosed in FIGS. 4A to D. As shown in FIG. A, a patterned conducting material 56 is applied to a silicon substrate 58. The pattern includes a particle-sized trough 60 which may be formed by any convenient means. A thin layer of sacrificial liner material 62 may be applied to the particle forming surface sidewalls such as by electroplating. A particle material layer 64 may be deposited on top of the sacrificial layer 62 such as by electrocoating or electroplating or other alternative means. The sacrificial layer 62 is then dissolved or otherwise removed to separate the particle 66 from the substrate 56.

Still another alternative process is illustrated in FIG. 5A to D and includes a silicon substrate 68 having a silicon dioxide layer 70 applied thereto with the plurality of particle trenches 72 carved therein or otherwise patterned therein using any appropriate method such as lithography, etc. A non-stick surface 74 may be conveniently applied across the entire patterned silicon dioxide layer 70. A layer of particle material 76 may be continuously applied and retained in the particle trough 72 by any convenient means including flowing the particle material 76 into the particle troughs 72. After the particle 78 has formed, it may be separated from the substrate 70 by vibration, centrifuge, or any other suitable means.

To further illustrate the present invention, the inventor has formed particles utilizing essentially the process illustrated in FIG. 2 except that a positive photoresist, reverse image process was utilized. An explanation of the general methodology and specific examples is now provided as an aid to further understand the present invention.

The particles of the present invention may be fabricated by applying a combination of photolithography, metal deposition and etching techniques. Using this approach, circular shaped flat particles (disks) have been prepared of the following materials: Cu, W, and sandwiches Cu/Ni/Cu, Si/Au/Si. The process of particle fabrication (except W particles) can generally be described in four steps:

I. Mask preparation

II. Wafer patterning

III. Metal deposition

IV. Lift off

Particle fabrication started with a mask whose pattern was created using computer aided design (CAD). A file was created which controlled the optical pattern generator. The file contained the parameters which defined the particle shape, size, and number. The pattern generator created the appropriate images and exposed the photoresist mask. The mask began as a piece of glass coated with a thin layer of chromium and photosensitive polymer, that is, photoresist. Depending on photoresist type, exposed or unexposed areas were removed using chemical development. The developed areas were removed to expose some areas of the chromium. Depending on the particle number and configuration, it was necessary to fabricate a secondary mask. Items such as cost of the mask production and the time dictated this step.

The next step was wafer patterning. Silicon wafers were coated with photoresist, exposed by UV light through the mask, and developed. The procedure of coating wafers with photoresist included cleaning the surface, priming it, and spinning photoresist onto it. Depending on the photoresist types these prepared wafers were baked before or (and) after light exposure to evaporate excessive solvent. Wafers were primed by washing them in acetone and isopropanol and applying primer to make their surface hydrophobic and prevent moisture from collecting. Photoresist was dripped from a pipet onto the wafer surface while it was spinning at high speed to spread photoresist over the surface (spin coating). The uniformity of the photoresist layer was critical for subsequent photolithography processing. Variations in photoresist thickness should not exceed 5–10 nm. The wafers were exposed using a 5-x or 10-x stepper Projection Mask Aligner. The image reversal process was used to obtain the negative structure using a positive photoresist. Contrary to negative photoresists, the positive one allowed higher resolution to be achieved (as a result, particles of smaller size and controllable shape were produced). Carboxylic acid was produced as a result of a light-assisted reaction in the photoresist, which increased the polymer solubility by a factor of ten. High temperature treatment in an ammonia environment was used to neutralize the carboxylic acid in the exposed areas of photoresist, thus making them poorly soluble and non-photosensitive. Subsequent flood UV exposure with contact aligner and development made the negative image on the wafer (leaving the initially exposed areas). Characterizing the patterned wafer with light and scanning electron microscopes was necessary to correct some stepper parameters like exposure time and focus settings, and thus obtaining good settings for these parameters. After washing and drying, the wafer was ready for the next steps. Fabrication of the particles with sharp corners required applying the optical proximity correction (OPC) method. This method is based on modifying the mask so that a uniform light intensity distribution of the bulk of the photoresist is achieved. By applying the OPC technique it should be possible to minimize the corner radius down to 100–200 nm on 0.5–1 $\mu$m size features.

Metal deposition was done with thermal or electron beam evaporation, sputtering, or electro-deposition. A variety of metals were deposited. The reasons for choosing one method or another are described for each case.

To lift off the particles the wafer was soaked in the appropriate organic solvent to remove the photoresist. Gentle sonication was required in some cases. W particles are to be lifted off by dissolving an aluminum sacrificial layer in the aluminum etchant. Centrifugation was used to separate the particles from the suspension.

EXAMPLE 1

Disk shaped Cu particles of 1 $\mu$m diameter and 200 nm thickness were fabricated using photolithography techniques. The mask (Telic Company, Calif.) for the desired configuration was made in two steps. The primary mask was exposed in a GCA PG3600F Optical Pattern Generator. All the CAD work was done using a VAX station-3100 Cluster for Computer Aided Design running the physical layout software SYMBAD (Cadence Design Systems, Inc., California). After exposure, the mask was developed in developer MF320(OCG Microelectronic Materials, Inc., New Jersey). CR-14 Chromium etchant (CYANTEK Corporation) was used to dissolve the part of the chromium film not protected with the developed photoresist. After this step the photoresist was stripped and the mask was washed in deionized water and dried in nitrogen. The primary mask for square production contains a 100×100 array of 25 $\mu$m squares on 75 $\mu$m centers. The secondary mask was made by photo-repeating the primary mask 30×30 times with 5× reduction. It was exposed through the primary mask with the GCA 6300 DSW Projection Mask Aligner and 5× g-line Stepper. The procedure of photoresist development and chromium etching is the same as for the primary mask. The number of elements on the secondary mask is 9×10$^6$. Making the secondary mask by repeating the primary one allowed a decrease in the time required for mask preparation and reduced the mask cost.

As substrates, 4-inch silicon p-type wafers were used from Silicon Quest International Corp., California The wafers were washed in acetone and isopropanol and then dried in nitrogen. Before spin-coating the photoresist the wafer surface was primed by keeping the wafers in hexamethyldisilazane at 90° C. for 30 minutes. The Yield Engineering Systems LP-III Vacuum Oven was used for this. Shipley S1813 photoresist was spun at 4000 rpm for 30 sec. plus 3 sec. for acceleration and deceleration. The spun photoresist was prebaked at 115° C. for 1 minute by placing the wafer onto a hot plate. The photoresist thickness and uniformity was checked by the Leitz MV-SP Spectrophotometer. Wafers were exposed through the secondary mask with UV light using a GCA 6300 DSW Projection Mask Aligner, 5× g-line Stepper. There were 89 prints made on each 4-inch wafer so that the number of the features on each wafer is 8·10$^8$.

Immediately after exposure, the wafers were treated at 90° C. in an ammonia environment (YES oven, 90 min.). Subsequent flood UV exposure for 2 minutes (Karl Suss MA6 contact aligner) and development in developer MF32 (OCG Microelectronic Materials, Inc., New Jersey) was followed by washing in deionized water and drying in nitrogen; the wafers were ready for metal deposition. A 200 nm thick layer of copper was thermally deposited with a CHA thermal evaporator. A 5 nm layer of chromium was predeposited for better adhesion. By predepositing after forming the elements, the 5 nm layer of chromium ended up as part of the particles formed in Examples 1 and 2. The chromium could have been deposited directly on the silicon wafer and the polymer spun coat on top of its which would eliminate the chromium from the particles.

To lift off the particles the wafer was soaked in acetone (100 ml) for 2 hours and then sonicated (95HT Tru-Sweep Ultrasonic Cleaner, Crest Ultrasonic Corp, New Jersey) for 5 seconds. The suspension was centrifuged (CL International Clinical Centrifuge, International Equipment CO., Mass.) and the acetone was removed with a pipet. The particles were washed in ethanol 5 times to remove acetone and photoresist residue.

EXAMPLE 2

In a manner similar to example 1, Cu/Ni/Cu disks were fabricated. The diameter of the particles was 1 $\mu$m, the thickness of the metal layers were 100 nm of Cu, 100 nm of Ni and 100 nm of Cu.

EXAMPLE 3

In a manner similar to example 2(with no chromium predeposited), Si/Au/Si disks were made. Silicon and gold layers were deposited by electron beam evaporation in the CVC SC4500 combination thermal/e-gun evaporation system. The diameter of the particles was 1 $\mu$m, the thickness of the layers were 20 nm of Si, 150 nm of Au and 20 nm of Si.

EXAMPLE 4

A mask for W disk fabrication was made in a manner similar to example 1. Due to the high temperature and the very slow rate of tungsten deposition in the system used, it was difficult to thermally deposit thick (>50 nm) layers onto a patterned wafer without damaging the photoresist. The following technique was used. A 200 nm layer of W was deposited by sputtering (CVC Sputter Deposition System) on the top of an Al "sacrificial" layer. 20 nm of Ta was predeposited onto the Si surface for better adhesion. The wafers were then primed by exposing them to hexamethyldisilazane in the YES oven at 90° C. for 30 minutes.

The photoresist was deposited and developed as before but the photoresist pattern on the top of the W layer was now used as a protective mask for etching off some of the surrounding W. To obtain sharp profiles reactive ion etching in a $CF_4$ plasma (RIE System, Applied Materials, California) was used. To lift off the particles, the A1 "sacrificial" layer was dissolved in the aluminum etchant. Particles were centrifuged and washed in water.

EXAMPLE 5

Ellipse-shaped flat W particles (ratio of diagonal axes 2 $\mu m/1\ \mu m$) and 200 nm thickness were fabricated. The new mask was made in the same way as in the example 4, except the mask was prepared by 10× stepping. The procedures of metal deposition, wafer washing and particle lift off are similar to those described in example 4. The primary mask contained a 100×100 array of rhombus with the diagonal axis ratio $50\ \mu m/100\ \mu m$ with 100 $\mu m$ spacing between them. The secondary mask was made by repeating the primary mask 10×10 times with 5× reduction. It was exposed through the primary mask with the GCA 630 DSW Projection Mask Aligner, 5× g-line Stepper. The number of elements on the secondary mask is $10^{6}$. Photoresist OIR 643 was spun at 4000 rpm for 30 sec. plus 3 sec. for acceleration and deceleration. The spun-coated photoresist was prebaked at 90° C. for 1 minute by placing the wafer onto the hot plate. Wafers were exposed through the secondary mask with UV light using GCA 6300 DSW Projection Mask Aligner, 10× i-line Stepper. 169 prints were made on each 4-inch wafer so that the number of the features on the wafer was $1.69 \cdot 10^8$. After exposing, the wafers were baked at 115° C. for 1.5 min. on the hot plate. Developer MF4262 (OCG Microelectronic Materials, Inc., New Jersey) was used to develop the photoresist.

Particles made by the inventor in utilizing the processes as described in the examples are illustrated in FIGS. 6 to 12.

Figure 6:
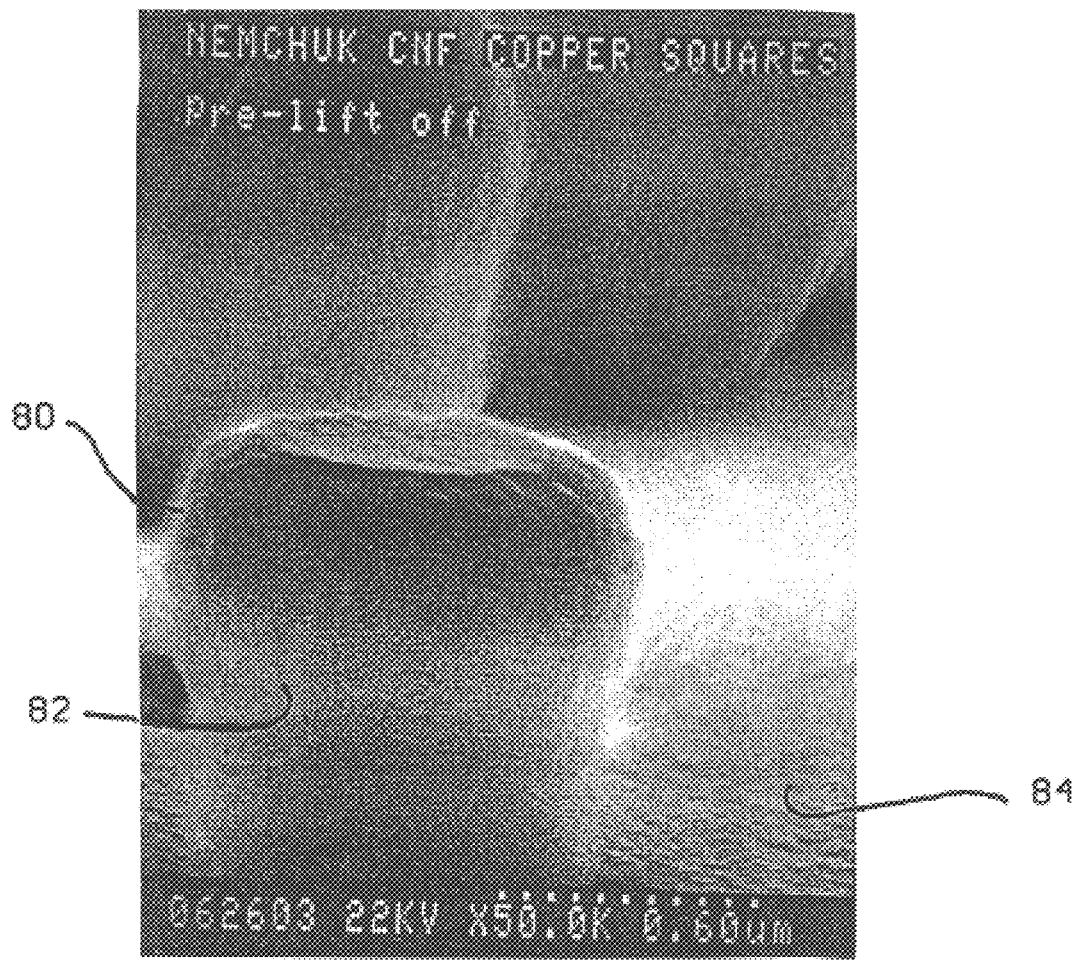
FIG. 6 is an electron microscope image depicting a particle adhered to an element on a substrate.

FIG. 6 illustrates particle 80 formed atop a pillar 82 of photoresist prior to its separation from the underlying substrate 84.

Figure 7:
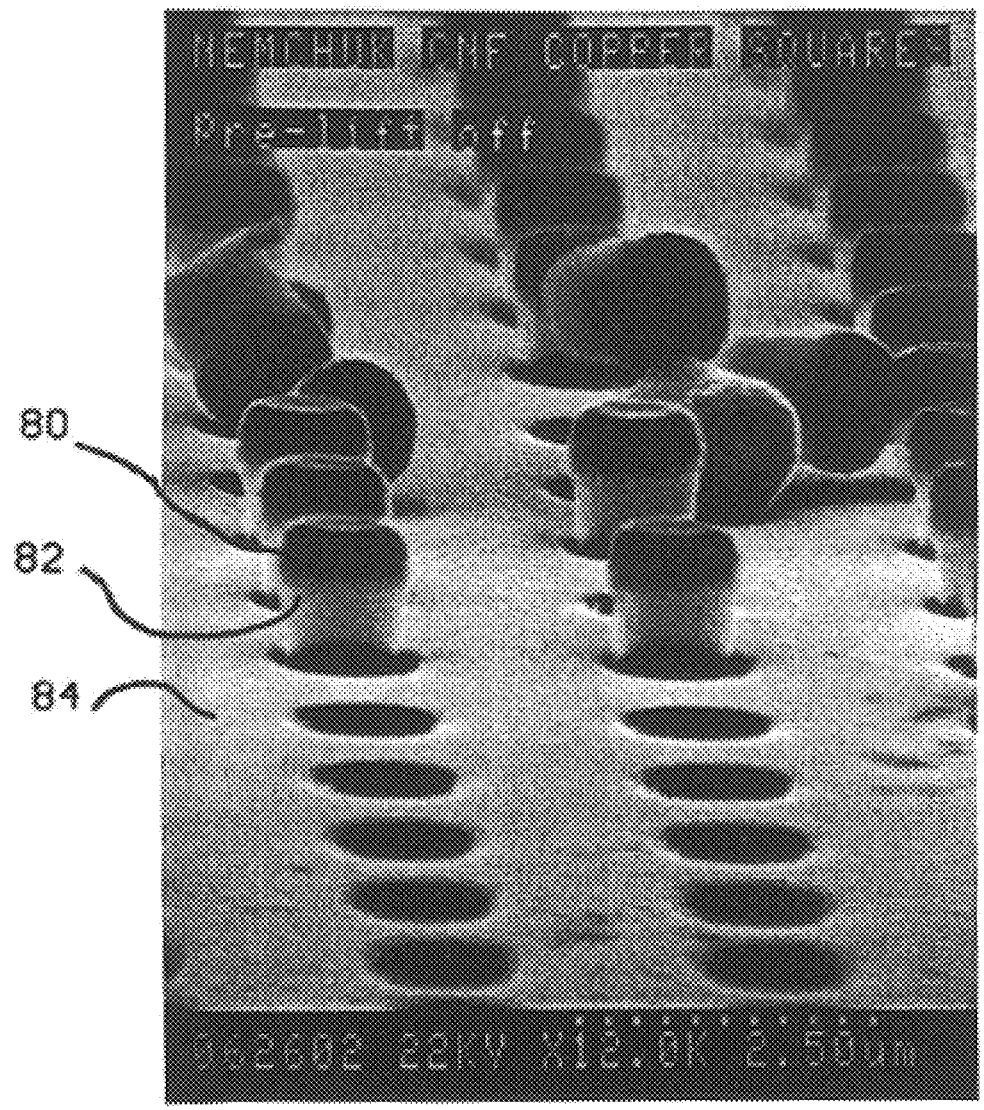
FIG. 7 is an electron microscope image illustrating a plurality of particles adhered to elements on a substrate.

FIG. 7 illustrates a plurality of particles 80 secured by pillars 82 to the underlying substrate 84.

Figure 8:
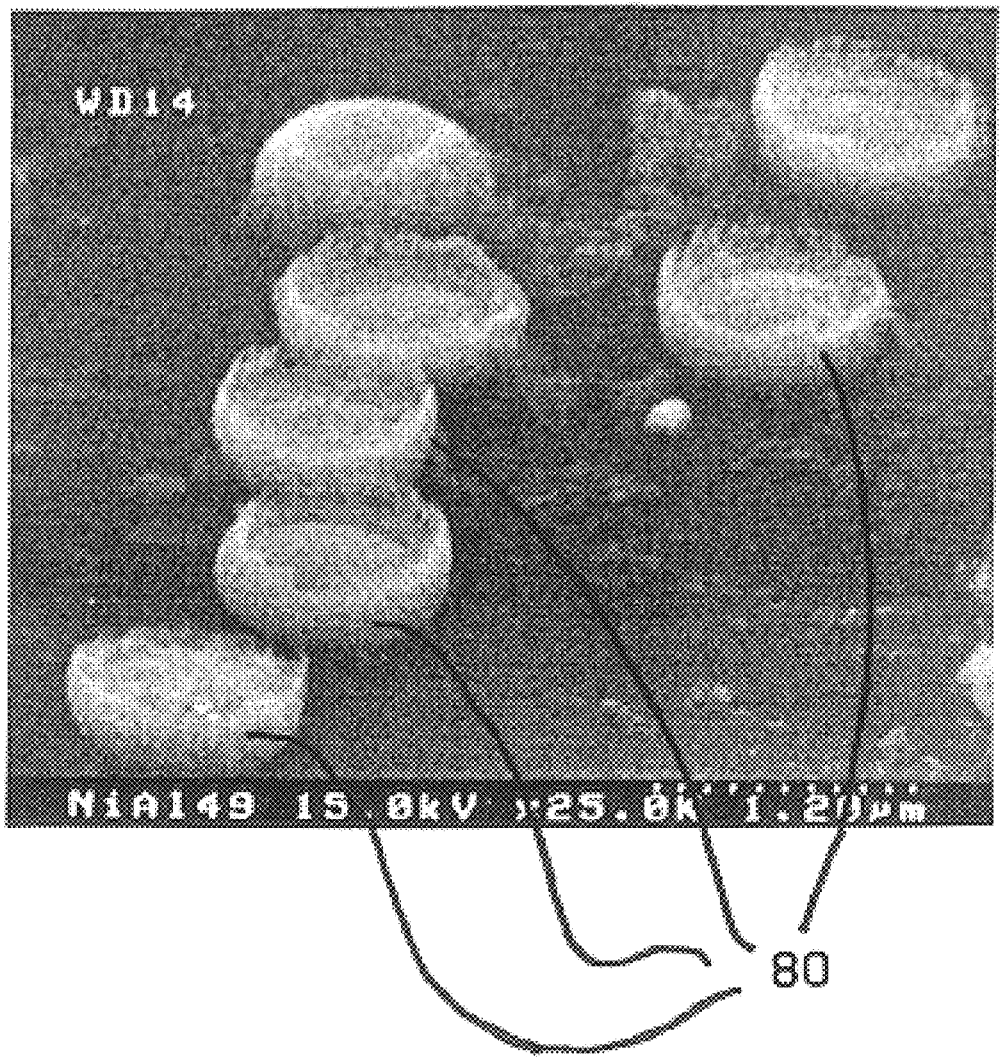
FIG. 8 is an electron microscope image illustrating a plurality of particles separated from the substrate.

FIG. 8 illustrates a plurality of uniformly sized and shaped particles 80 after separation from the pillars 82.

Figure 9:
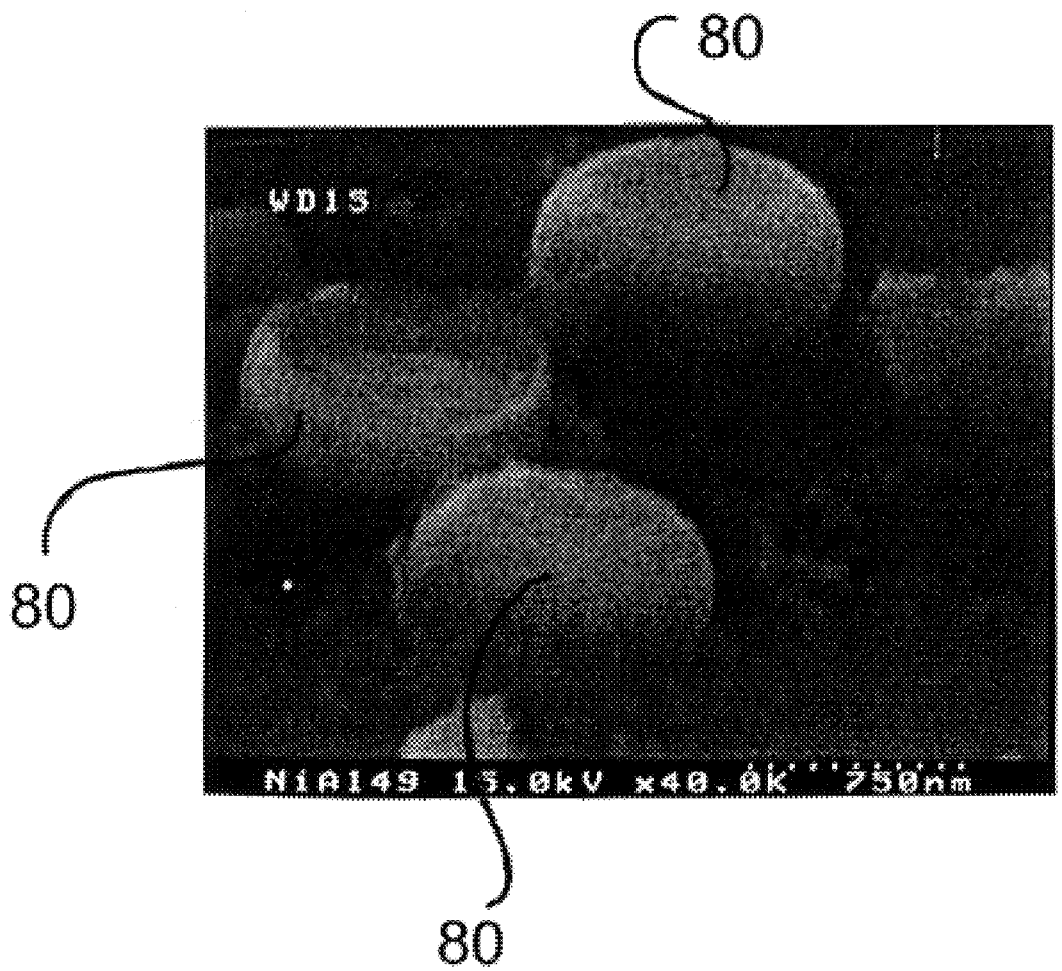
FIG. 9 is an electron microscope image illustrating a plurality of uniformly sized and shaped particles formed through the process of the present invention.

As shown in FIG. 9, the particles 80 have a definite dislike shape and are seen to be uniformly sized and shaped.

As illustrated in FIG. 10, the particles 80 are conveniently shaped for acceleration and impact into a surface 86 which illustrates their desirability for biolistic applications.

Figure 11:
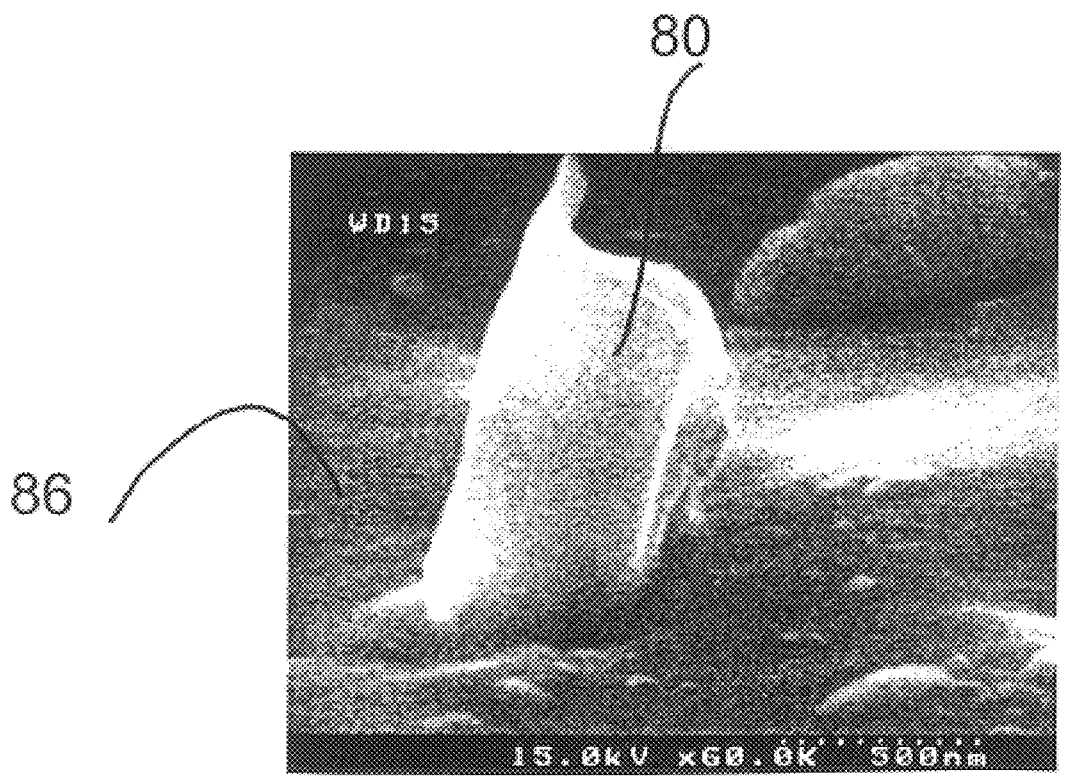
FIG. 11 is an electron microscope image similar to FIG. 10 except at greater magnification.
Figure 12:
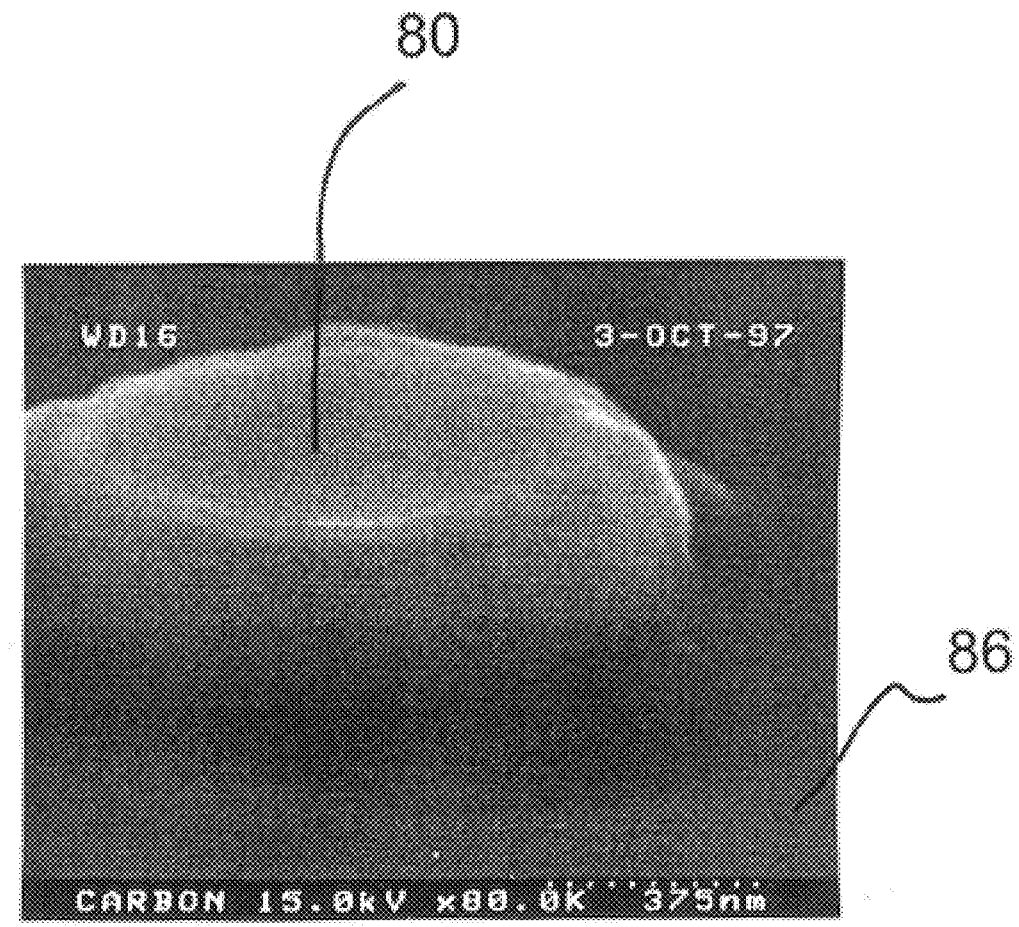
FIG. 12 is an electron microscope image illustrating a particle of the present invention pancaked onto a surface as would be experienced in a biolistic particle application.

FIG. 11 illustrates a magnified view of a particle 80 which has been propelled into a surface 86. While the particles 80 may impact a surface 86 on edge so as to lodge therein, as illustrated in FIGS. 10 and 11, the particles 80 may also "pancake" on the surface 86 as illustrated in FIG. 12.

The inventor's description of the preferred embodiment, including the various alternative processes for producing submicron particles, and the particles themselves, have been given to illustrate the various aspects of the invention. One of ordinary skill in the art would understand that these processes are amenable for use with various kinds of materials. For example, the material which comprises the particles themselves would be any materials amenable to a deposition process. This includes many different kinds of metals, insulators, semiconductors, ceramics, and glasses, essentially including any that can be deposited by thermal and electron-beam evaporation, by electrochemical deposition methods (electroplating, electroless deposition), by laser ablation and sputtering of material to be deposited, and any other technique that allows for material deposition on a surface. The processes disclosed in the preferred embodiments also utilize a lithographic process for preparing the substrate. The inventor has used this lithographic process, i.e. photolithographic process, to actually prepare a silicon wafer substrate with a layer of photoresist thereon in making submicron sized particles. However, it should be understood that the substrate surface may be prepared utilizing any other suitable process in order to define a pattern on which particles can be made, and then removed from, the substrate. For example, with imprint lithography the polymer does not have to be a photoresist, it can simply be a polymer which imprints well. Or, the patterned surface may have insulating silicon dioxide regions which define (through the patterning) conducting regions on a substrate; certain materials could be electroplated onto these conducting regions, and then removed (for example by scotch tape for particles deposited on a relatively non-stick surface).

In still another aspect of the invention, the formed particles are separated from the substrate. Various processes are disclosed herein to achieve that separation. However, any suitable methodology for separating the particles from the substrate may be used as the invention should not be viewed as being limited to the particular methods disclosed, including vibrating, pulling them off with an adhesive surface such as tape, removal by dissolution of an underlying sacrificial layer, centrifuging, sonicating, etc. In still another aspect of the invention, various shapes and sizes of particles are disclosed. The shapes and sizes of particles which may be made using the inventor's process are virtually infinite. Therefore, the invention is not limited to any particular size or shape, or range of size and shape particle. In still another aspect of the invention, and as explained above in the examples given and description of the preferred embodiment, a single harvest of particles produces a plurality of particles of uniform size and shape. However, as one of ordinary skill in the art would understand, the size and shape of the particles is determined by the preparation of the substrate surface. For example, using the photolithographic mask disclosed herein, the inventor found it convenient to utilize techniques which resulted in a single particle shape and size being chosen and prepared during any particular pass through the process. One of ordinary skill in the art would readily understand and appreciate that the invention is broad enough to encompass the preparation of a photolithographic mask having a wide range and array of particle shapes and sizes which may be produced during the same pass of the process. Indeed, for some applications, it may be desirable to have particles of varying dimension and shape in the same "harvested" plurality of particles. Using the inventions disclosed herein, one will be able to produce this varied collection of particles by predetermining their shape and size. These advantages and features of the invention are taught herein and should be considered as part of the invention.

The foregoing examples are not meant to be exhaustive and instead are meant to be illustrative of the scope and content of the invention. On further thought, one of ordinary skill in the art would readily understand and appreciate that the teaching of the specification is broader than that which is contained in the description of the preferred embodiment and examples given. Therefore, the scope of the invention should be limited only by the scope of the claims appended hereto, and their equivalents.

What is claimed is:

1. An array comprised of a plurality of discrete substantially uniformly sized and substantially uniformly disk-shaped particles formed on an upper surface of a substrate, said particles being separable from said substrate and about 0.1 microns to about 25 microns in diameter.

2. The array of claim 1 wherein said array is substantially planar.

3. An array comprised of a plurality of discrete substantially uniformly sized and substantially uniformly shaped particles formed on an upper surface of a substrate, said particles being separable from said substrate and about 0.1 microns to about 25 microns in diameter, and wherein each of said particles has an internal surface area when separated from said substrate.

4. The array of claim 3 wherein said internal surface area comprises a generally circular opening in said particle.

5. The array of claim 4 wherein said array is substantially planar.

6. The array of claim 3 wherein said array is substantially planar.

* * * * *